United States Patent [19]
Kaneko et al.

[11] Patent Number: 6,051,872
[45] Date of Patent: Apr. 18, 2000

[54] SEMICONDUCTOR INTEGRATION DEVICE AND FABRICATION METHOD OF THE SAME

[75] Inventors: Satoru Kaneko, Kumagaya; Masayuki Kawaguchi; Hirotsugu Hata, both of Gunma, all of Japan

[73] Assignee: Sanyo Electric Co., Ltd., Osaka, Japan

[21] Appl. No.: 09/032,103

[22] Filed: Feb. 27, 1998

[30] Foreign Application Priority Data

| Feb. 28, 1997 | [JP] | Japan | 9-046768 |
| Feb. 28, 1997 | [JP] | Japan | 9-046769 |
| Mar. 14, 1997 | [JP] | Japan | 9-061096 |

[51] Int. Cl.$^7$ ................................. H01L 27/082
[52] U.S. Cl. ........................... 257/587; 257/588
[58] Field of Search .................... 257/588, 565, 257/587

[56] References Cited

U.S. PATENT DOCUMENTS 4,812,417  3/1989  Hirao ........................ 257/588

FOREIGN PATENT DOCUMENTS

| 62-163358 | 7/1987 | Japan . |
| 2576373   | 8/1994 | Japan . |
| 7-235547  | 9/1995 | Japan . |

*Primary Examiner*—Mark V. Prenty
*Attorney, Agent, or Firm*—Cantor Colburn LLP

[57] ABSTRACT

A lead electrode (57) is formed to expose an active base region (61). On the lead electrode (57) is formed a lead electrode (64) for an emitter electrode via an insulation film (56). When a base contact hole (65') for exposing the lead electrode (57) and an emitter contact hole for exposing the lead electrode (64) are formed at the same time, total thickness of the insulation film on the lead electrode (64) is thinner than that of the insulation layer on the lead electrode (57), which results in excessive etching on a part of the surface of the lead electrode to form recess. The lead electrode (64) is led out to a LOCOS film to form the emitter contact hole in a region on the LOCOS film to expose the lead electrode (64). Therefore, the recess having been formed on the lead electrode (64) upon forming the emitter contact hole is made to form on the LOCOS film outside the emitter region. The recess prevents depth of the emitter region from dispersing.

9 Claims, 12 Drawing Sheets

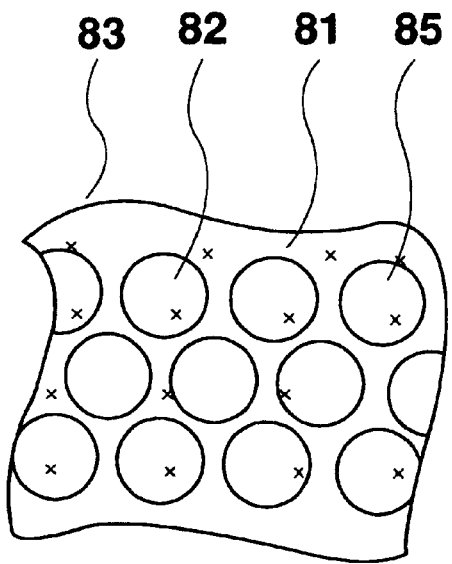
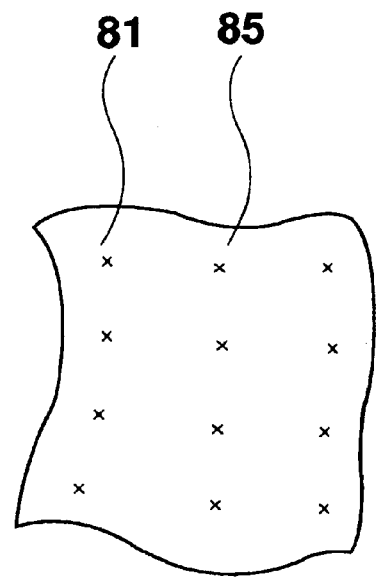
Fig. 8A      Fig. 8B
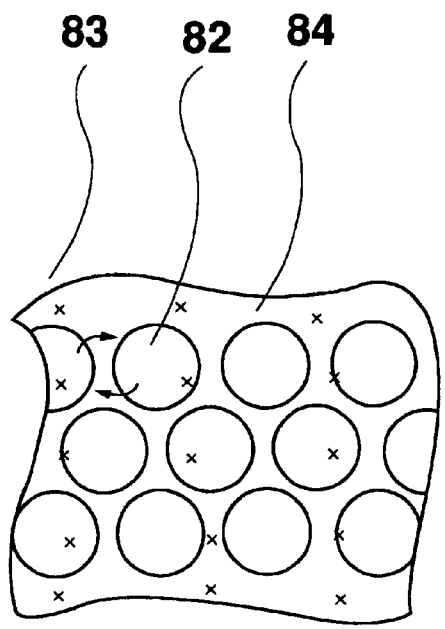
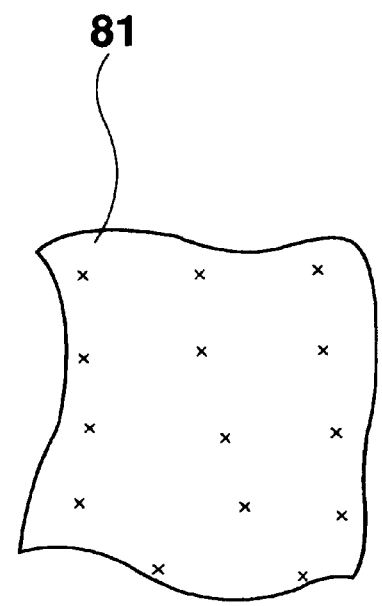
Fig. 9A      Fig. 9B

SEMICONDUCTOR INTEGRATION DEVICE AND FABRICATION METHOD OF THE SAME

BACKGROUND OF THE INVENTION

1. Field of the Invention

The present invention relates to a semiconductor integration circuit with restrained $h_{FE}$ dispersion.

2. Description of the Prior Art

Techniques have been proposed for obtaining a very fine base-emitter junction. For example, such a technique is disclosed in Japanese Patent Laid-Open Publication No. Hei 7-235547. The following describe the technique by reference to the accompanying drawings, FIGS. 1A through 1G.

First, as shown in FIG. 1A, an n-type semiconductor layer 11 to become a collector is formed on a p-type semiconductor substrate using an epitaxial growth method. A surface of the semiconductor layer 11 is selectively oxidized to form a LOCOS oxidized film 12 for separating elements. There is an n+-type buried layer 13. At a bottom of the LOCOS layer 12 is formed a p+-type separating region for making pn junction and separation of the n-type epitaxial layer.

A CVD oxidized film is deposited on the entire surface. Photo-etching is done to leave an insulation film 15 on the semiconductor layer to be emitter-diffused.

In turn, as shown in FIG. 1B, a surface of the semiconductor layer 11 not covered by the insulation film 15 has a polysilicon layer by the selective epitaxial growth method formed thereon to form a first silicon layer 16. After that, boron is ion-doped to an impurity for external base diffusion into the first silicon layer 16. Further, a silicon layer is deposited on the whole surface by the LPCVD method to form a second silicon layer 17.

Boron is then ion-injected to make the second silicon layer 17 conductive. The second silicon layer 17 is photo-etched to make the first and second silicon layers 16 and 17 form a base lead electrode 18. At the same time, the insulation film 15 is made open thereon to expose a top of the insulation film 15 (see FIG. 1C).

Next, as shown in FIG. 1D, the insulation film 15 is removed to form an opening 19 to expose the surface of the semiconductor layer 11. After that, as shown in FIG. 1E, the entire part is heat-oxidized to form a heat oxidized film 20 on the surface of the semiconductor layer 11 and surfaces of the first and second silicon layers 16 and 17. At the same time, the impurity doped from the first silicon layer 16 is diffused to form an external base region 21. Further, boron for forming an active base region is ion-injected without mask.

Next, as shown in FIG. 1F, a polysilicon layer is deposited on the entire surface. The layer is anisotropically dry-etched to form a side wall 22 on a side wall of an opening 19. After that, an HTO (high temperature oxide) 23 is formed on the entire surface. Further, the HTO is etch-backed to again expose the surface of the semiconductor layer 11 at the opening 19 again.

Finally, as shown in FIG. 1G, a polysilicon layer is deposited by the CVD method. The impurity for emitter diffusion is doped. After that the polysilicon layer is photo-etched to form an emitter lead electrode 24 at the opening 19. The entire substrate is heat-treated to diffuse the previously doped ion to form an active base region 25. At the same time, an emitter region 26 is formed by way of solid-phase diffusion from the emitter lead electrode 24.

An insulation layer is further adhered to the entire surface to form an emitter contact and base contact and form an emitter electrode and base electrode through a contact hole.

Using the method described above, a very small high-frequency transistor can be fabricated.

FIG. 2 shows structures of the first silicon layer 16 and base lead electrode 18 of FIGS. 1B to 1D integrated of polysilicon. Additionally a semiconductor integrated circuit device shown in FIG. 2 is formed in the process described above.

In the semiconductor integrated circuit device, after the step of forming the emitter lead electrode 24 (FIG. 1G), insulation film 27 is adhered to the whole surface as in the prior art described above to form an emitter contact 28, a base contact 29, and a collector contact 32 and form an emitter electrode 30, a base electrode 31, and a collector electrode 33.

As shown in FIG. 3, the lead electrode 24 on the emitter region 26 is etched, and then a recess 34 is formed on the lead electrode 24. As the diffusion source is removed, it becomes difficult to be uniform diffusion of the impurity. This causes a problem of differing depths of the emitter region 26.

The problem is present in the art described by reference to FIGS. 1A to 1G and the art in FIG. 2, and is described below by reference to FIG. 2.

As shown in FIG. 2, the insulation film 27 spread in the region in which the emitter contact 28, the base contact 29, and the collector contact 32 are formed, differs in the film thickness depending on position.

That is, area of the emitter contact 28 is covered with the insulation film 27, area of the base contact 29 has covered with the HTO film along with the insulation film 27, and area of the collector contact 32 is covered with the heat oxidized film 20 along with the insulation film 27. When the collector contact 32 and the base contact 29 are fully opened, the emitter lead electrode 24 is etched, forming a recess 34 on the electrode 24 because the film thickness of the area of emitter contact 28 is thinner than that of areas of the base and collector contact 29 and 32.

When a recess 34 is formed on a top of the emitter region 26, impurities to be doped to emitter are removed by the etching and the diffusion depth of the emitter diffusion region 26 becomes different. This makes it impossible to obtain a desired $h_{FE}$ and causes dispersion.

SUMMARY OF THE INVENTION

The foregoing object is accomplished in accordance with aspects of the present invention by a semiconductor integration device comprising: a base region having a first insulation film formed on a semiconductor layer with an opening through which the base region is exposed, an active base region being formed at about a center of the base region and an external base region formed to enclose the active base region, wherein the active base region and the external base region construct the base region, an emitter region formed in the active base region, a lead electrode for the external base region opened on the active base region, being led out from the external base region to an area on the first insulation film outside an external base forming region, a second insulation film covering the lead electrode for the external base region, being opened on the active base region, a side wall formed on a side of a base opening of the second insulation film formed on the active base region, a lead electrode for the emitter region functioning as impurity diffusion source for the emitter region, being made to contact the emitter region through an emitter opening constructed on the emitter region by the side wall and being led out of at least the emitter opening, a third insulation film formed to cover the lead electrode for the emitter region and the second insulation film, a base contact hole formed to have a part of the lead electrode for the external base region exposed, an emitter contact hole formed to have a part of the lead electrode for the emitter region outside the emitter opening, and a base electrode formed in the base contact hole and an emitter electrode formed in the emitter contact hole.

In this aspect, the lead electrode for the external base region and/or the side wall is a silicon film of amorphous silicon or a silicon film heat-treated amorphous silicon.

An other aspect of the present invention is to provide a semiconductor integration device comprising: a base region having a first insulation film formed on a semiconductor layer with an opening through which the base region is exposed, an active base region and an external base region formed to enclose the active base region, constructing the base region, an emitter region formed in the active base region, a lead electrode for the external base region opened on the active base region, being formed on the external base region, a second insulation film covering the lead electrode for the external base region, being opened on the active base region, a side wall formed on a side of a base opening of the second insulation film formed on the active base region, a lead electrode for an emitter region made to contact the emitter region through an emitter opening constructed on the emitter region by the side wall, a third insulation film formed to cover the lead electrode for the emitter region and the second insulation film, a base contact hole formed to have a part of a lead electrode for the external base region exposed, an emitter contact hole formed to have a part of the lead electrode for the emitter region outside the emitter opening, a base electrode formed in the base contact hole and an emitter electrode formed in the emitter contact hole, and a lead electrode for the external base region and/or the side wall is a silicon film of amorphous silicon or a silicon film of heat-treated amorphous silicon.

The foregoing object may also be accomplished in accordance with aspects of the present invention by the semiconductor integration device comprising: a base region and a collector region having a first insulation film formed on a semiconductor layer with an opening to expose the base region and the collector region, an active base region being formed at about a center of the base region and an external base region formed to enclose the active base region, wherein the active base region and the external base region construct the base region, an emitter region formed in the active base region, a lead electrode for the external base region opened on the active base region, being led out from the external base region to an area on the first insulation film outside an external base forming region, a second insulation film covering the lead electrode for the external base region, being opened on the active base region, a side wall formed on a side of a base opening of the second insulation film formed on the active base region, a lead electrode for the emitter region functioning as impurity dispersion source for the emitter region, being made to contact the emitter region through an emitter opening constructed on the emitter region by the side wall and being led out of at least the emitter opening, a third insulation film formed to cover the lead electrode for the emitter region and the second insulation film, a collector contact hole formed to have a part of the collector region exposed, an emitter contact hole formed to have a part of the lead electrode for the emitter region outside the emitter opening, and an emitter electrode formed in the emitter contact hole and a collector electrode formed in the collector contact hole.

As described above, the lead electrode of the emitter region is made to spread as the diffusion source to around the opening constructed of the side wall exposed having the emitter region exposed (preferably on the LOCOS film) and the emitter contact is formed around the opening. The insulation film positioned at the base contact is thick and the emitter lead electrode is etched until the base contact hole can be fully opened. However, as forming the emitter contact (recessed) is shifted from the emitter region, there no variation in the diffusion depth is caused in the emitter region.

Also, the insulation film positioned at the collector contact is thick and the emitter lead electrode is etched until the collector contact hole can be fully opened. However, as the forming of the emitter contact (recessed) is shifted from the emitter region, there no variation in the diffusion depth is caused in the emitter region.

A further aspect of the present invention is a semiconductor device fabrication method, wherein a semiconductor layer constructing a collector region has a base region formed therein, the base region having an active base region and an external base region, comprising steps of: a first insulation film having an opening to have a base forming region in the semiconductor layer exposed is formed on the semiconductor layer, a silicon film of amorphous silicon or a silicon film of heat-treated amorphous silicon is formed on the semiconductor layer exposed at the opening, a region of the silicon film on an active base forming region is selectively removed; and a remained silicon film on the semiconductor layer is used as a diffusion source of impurity to diffuse the impurity into the semiconductor layer and used as the external base region, and the active base region is formed by removing the silicon film on the active base forming region and by doping impurity to the semiconductor layer exposed.

As described above, one method according to the present invention uses an amorphous silicon film or a silicon film heat-treated amorphous silicon as the diffusion source.

First, as the amorphous silicon (hereinafter referred to as a-Si) has no grain and grain boundary, the method can realize a surface having no irregularities, even after etching, even if the film is adhered with a-Si before being heat-treated, as will be described later. The diffusion source can restrain irregularities of the diffusion region and of the semiconductor surface.

Further, the method according to the present invention can accomplish low sheet resistance of the heat-treated a-Si film. The diffusion source is remained as the lead electrode of the base region. This can accomplish low lead resistance.

In another view of the present invention, this is a fabrication method of semiconductor device, wherein a semiconductor layer constructing a collector region has a base region formed therein, the base region having an active base region formed therein, comprising steps of: a first insulation film having an opening to have a base forming region in the semiconductor layer exposed is formed on the semiconductor layer, a first silicon film is formed on the semiconductor layer exposed at the opening, a second insulation film is formed on the first silicon film, the first silicon film and the second insulation film are made open to expose an active base forming region, the active base region is formed by doping an impurity into the exposed active base forming region; the external base region is formed by using first silicon film remained on the semiconductor layer as a diffusion source and by diffusing the impurity into the semiconductor layer, a side wall is formed of a silicon film of amorphous silicon or a silicon film heat-treated amorphous silicon on a side of the opening formed on the second insulation film, an impurity doping hole for forming an emitter region is formed by removing an insulation film formed on a surface of the semiconductor layer with the side wall used as a mask, and a second silicon film is formed in the impurity doping hole for use as an impurity diffusion source to the emitter region.

The first silicon film may be amorphous silicon film or silicon film heat-treated amorphous silicon.

The foregoing problems are solved in the following ways. As described above, the opening is enclosed by the side wall on the insulation layer positioned roughly at the overlapped portion of the external base and active base region. The opening is made to serve as the doping hole for the emitter region. The side wall is formed of the amorphous silicon or the film that amorphous silicon is heat-treated.

The a-Si or the film that amorphous silicon is heat-treated and can have a smooth surface formed even with etching as there in no difference in grain size and grain boundary. It therefore cannot have the emitter shape made irregular, even with the impurity ion-injected through the side wall.

The exposed portion of the insulation film between the side wall and the semiconductor surface is self-aligned with the side wall. The emitter shape therefore cannot be made irregular even with the impurity introduced through the exposed portion.

Further, to restrain dispersion of the $h_{FE}$ characteristic of the transistor, the side wall made of polysilicon is replaced by a-Si or a film with adhered a-Si before being heat-treated. The impurity is introduced through the side wall.

Furthermore, the a-Si film or the film that a-Si is attached first before being heat-treated is used as the diffusion source instead of polysilicon.

As a-Si has no grain and grain boundary, there can be realized a surface with restrained irregularities, even with etching. Also, a film with adhered a-Si before heattreating can be realized, with surface irregularities and irregularities of the diffusion region and semiconductor surface restrained.

Also, there can be accomplished the heat-treated a-Si film having low sheet resistance. Low lead resistance can be accomplished by remaining the diffusion source made of the heat-treated a-Si file as the lead electrode of the base region.

BRIEF DESCRIPTION OF THE DRAWINGS

In the accompanying drawings:

FIGS. 8A and 8B are a view illustrating a state having ion doped into the silicon films in FIGS. 7A and 7B.

FIGS. 9A and 9B are a view illustrating a state having the silicon films in FIGS. 8A and 8B annealed.

DETAILED DESCRIPTION OF THE PREFERRED EMBODIMENT

Figure 4:
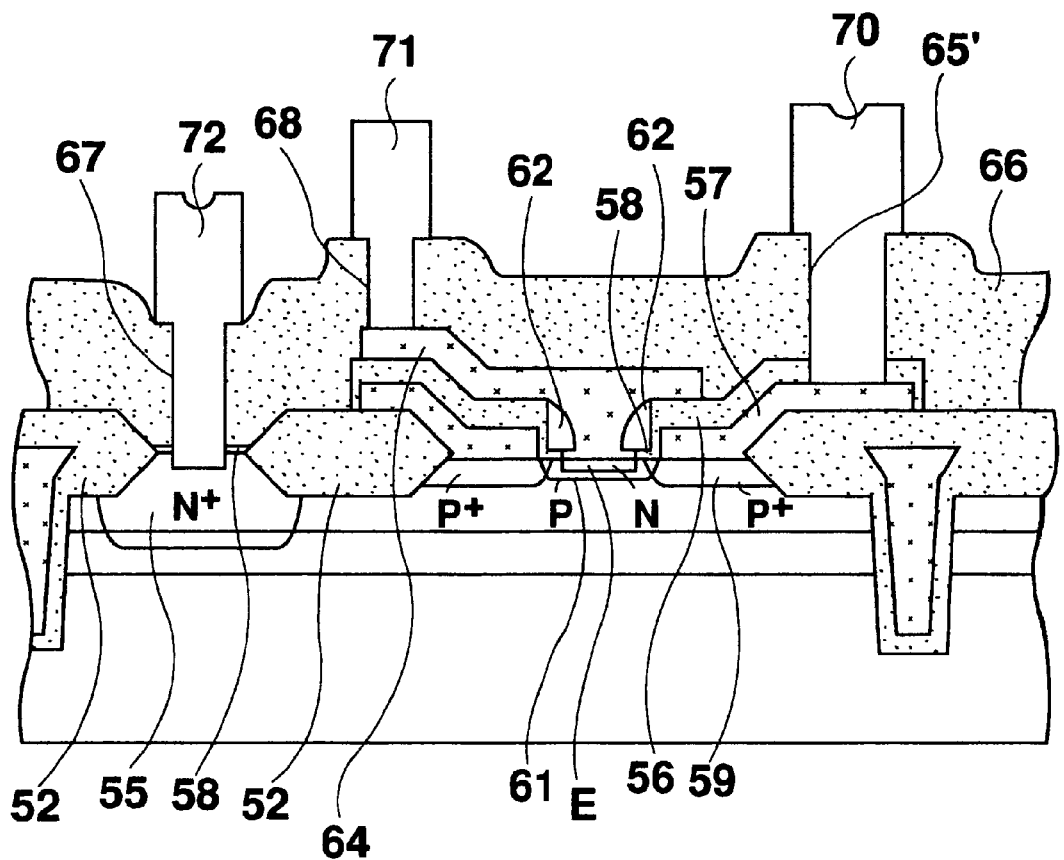
FIG. 4 is a cross-sectional view illustrating the semiconductor integration device in an embodiment according to the present invention.

The following describes embodiment to the present invention by reference to the accompanying drawings, FIGS. 4 and 5A to 5D. Referring to FIG. 4, the construction is described briefly below. A LOCOS film 52 is formed to make a collector contact region 55 and a base region expose, the base region being made of an active base region 61 and an external base region 59. The external base region 59 is formed to have an impurity of a lead electrode 57 made of silicon substance diffused therein. The lead electrode 57 is put with an insulation film 56 around it, the insulation film 56 having an opening and wherein an active base region 61 is exposed. A side wall 62 is formed on a side of an opening which the active base region 61 is exposed. The opening defined by the side wall 62 serves as a path for the impurity to be doped to an emitter. The side wall 62 is an injection hole for injecting the impurity of the emitter and serves as a mask for etching to form an introduction hole in diffusion by a solid phase diffusion source.

A portion at which a base contact hole 65' is positioned has insulation films 56 and 66 formed thereat. A portion at which a collector contact hole 67 is positioned also has a heat oxidized film 58 and the insulation film 66 formed thereat. A portion at which an emitter contact hole 68 of an emitter lead electrode 64 is positioned also has the insulation film 66 formed thereat.

The present invention is featured in that the emitter contact hole 68 of an emitter electrode 71 is not put right on the opening enclosed by the side wall 62, but around the opening, for example, on the LOCOS film 52.

That is, as the emitter contact hole 68 is shifted, a recess of lead electrode 64 is not formed right over the emitter region so that the impurity can be fully doped by the lead electrode 64. This can restrain formation of a recess in the emitter region.

The following describes in detail a method of fabrication of the present invention by reference to the accompanying drawings, FIGS. 4 and 5A, 5B, 5C, and 5D.

Figure 5A:
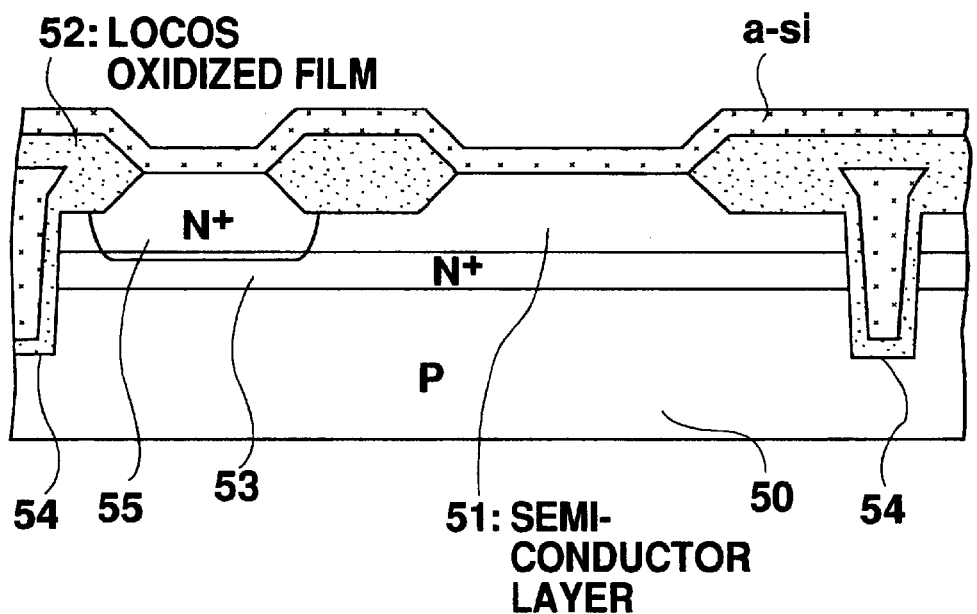
FIGS. 5A, 5B, 5C, and 5D are cross-sectional views illustrating a fabrication method of the semiconductor integration device in an embodiment according to the present invention.

First, referring to FIG. 5A, epitaxial growth is made on a p-type semiconductor substrate 50 to form an n-type semiconductor layer 51, which becomes a collector. A surface of the semiconductor layer 51 is selectively oxidized to form the LOCOS film 52 for separating elements. The LOCOS film 52 may be alternatively made of simple thick insulation film. A buried layer 53 is of n+ type. A trench 54 is formed at a bottom of the LOCOS film 52 to electrically isolate an n-type epitaxial layer. A p+ isolation region may be formed instead.

The LOCOS film 52 encloses a region in which a transistor is formed (hereinafter referred to as the transistor formed region) and has a collector contact region 55 and a semiconductor layer 51 exposed, the semiconductor layer 51 becoming regions 59 and 61 in which a base is formed later (hereinafter referred to as the base region) (see FIG. 4). An a-Si is formed to around 2000 Angstrom thick on a whole surface thereof by way of CVD and $BF_2$ ion are doped. There are some methods of ion doping to the a-Si, one of it is injecting the impurity to the a-Si forming gas, which is a gas contained H and Si, for example, shiran made of $H_2$ and Si. The other method is solid-diffusion, in which the film contained the impurity is formed on the a-Si film and then the impurity is diffused to the a-Si. It is preferable here to employ the ion implantation that allows accurate control of resistance and concentration of an external base to make use of the a-Si as diffusion source and also as lead electrode.

It is important here that in adhesion of Si during forming an a-Si layer on the exposed portions of the LOCOS film 52 and the semiconductor layer 51, adhesion of polysilicon is not made, but adhesion of a-Si is made with the gas of $H_2$ and silicon by way of LPCVD or plasma CVD in a low film forming temperature. At final step of process, the film may be untreated a-Si or it may be heat-treated.

Figure 5B:
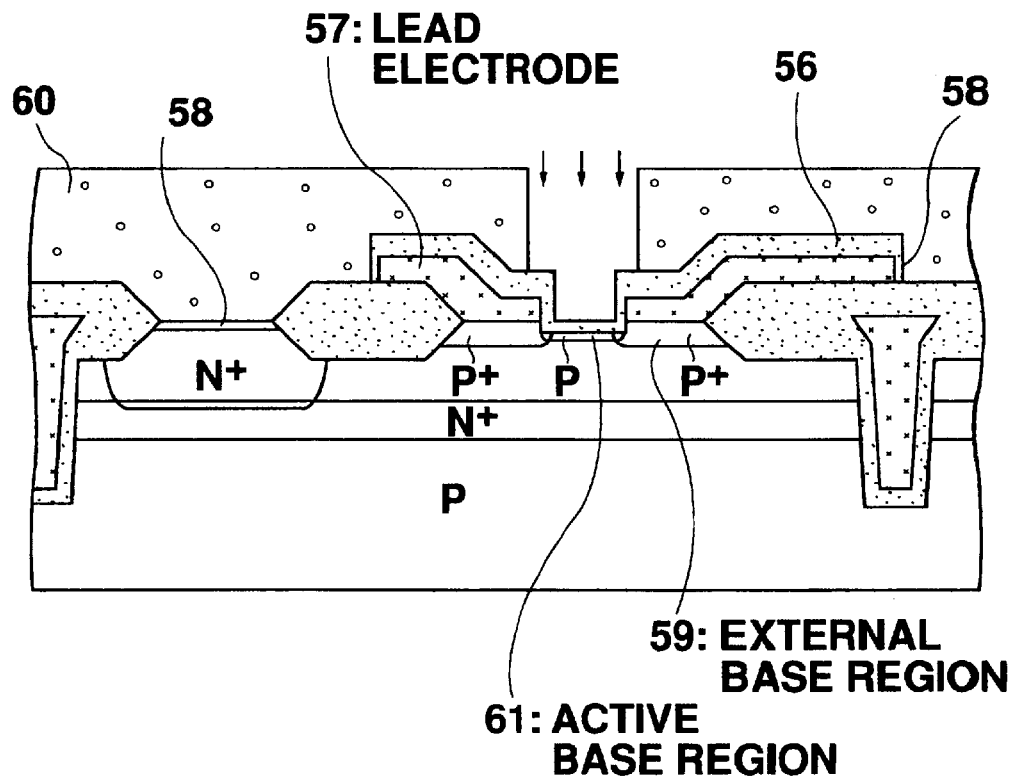

In turn, the LOCOS oxidized film 52 has the insulation film 56 formed on its entire surface. The insulation film 56 is silicon oxidized film of around 2000 Angstrom formed by way of CVD. After that, as shown in FIG. 5B, the a-Si film and the insulation film 56 undergo etching. The a-Si film constructed the future lead electrode 57 is spread on a portion corresponding to the region in which the external base region 59 is formed and on the LOCOS film 52 adjoining the region. The spread a-Si film is used as the lead electrode 57 and diffusion source by way of later impurity introduction. In etching, a semiconductor layer surface corresponding to a region in which the active base region is formed later undergoes light etching.

The surface of the lead electrode 57 and the region in which the active base region is formed is made smooth as they are formed of the a-Si film or film of heat-treated a-Si.

If the lead electrode 57 is formed of polysilicon, the surface of the lead electrode 57 is made uneven because of different etching speeds of the grain boundary and grain. As etching of the film corresponding to the active base region 61 comes close to the semiconductor surface, the grain boundary is clearly eliminated. However, the grain remains. As a result, the semiconductor layer positioned around the grain undergoes etching prior to the region under the remained grain, so that the exposed semiconductor layer 51 is made uneven on the surface thereof. This increases unevenness of the surface and contact resistance at a later step of forming a diffusion region described below.

However, the unevenness can be restrained because of use of the a-Si film or the film of heat-treated a-Si.

In turn, the whole surface is heat-oxidized to form a heat oxidized film 58 of around 100 to 200 Angstrom on the a-Si surface and the surface of the semiconductor layer 51. At this step, the impurity in a-Si is slightly diffused into the semiconductor layer 51 to form one part of external base region 59. Further, a resist 60 is used as a mask for ion doping and the impurity $BF_2$ for the base is doped to the semiconductor layer 51 through the heat oxidized film 58. As a result, the active base region 61 is formed at a later step of heat treatment (see FIG. 5B).

Since the unevenness of the surface of the active base region 61 is restrained, as described above, the diffusion speed at the step is made substantially uniform for all surfaces.

Figure 5C:
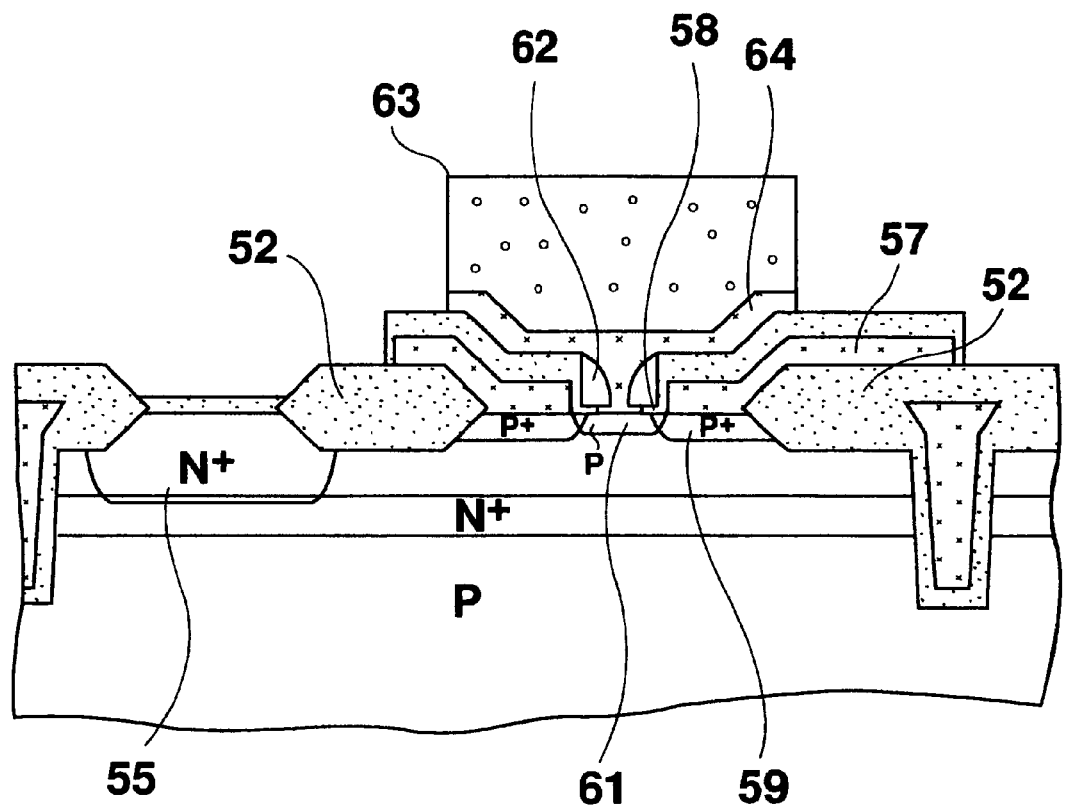

To secure insulation at each of the side walls between the lead electrode 64 of the emitter electrode, formed later as shown in FIG. 5C, and the base lead electrode 57, the whole surface is adhered with HTO (high temperature oxide) by way of LPCVD or plasma CVD. Further, after the etch-back, the surface has a side wall 62 formed on a portion corresponding to the active base region 61 (see FIG. 5C). The side wall 62 which also is made of a-Si is formed by way of an etch-back that a-Si formed on the whole surface undergoes anisotropic etching.

Although the impurity of the emitter may be ion implanted through the side wall, it is made here that the heat oxidized film 58 on the surface of the active base region 61 is eliminated by way of wet etching as solid phase diffusion, which is diffusion with use of the lead electrode 64.

Since the step described above forms side wall 62 of the a-Si film or the film of heat-treated a-Si, the resulted side wall can be made even on the surface thereof. In the former ion implantation, side wall is used as a mask. In the latter sold diffusion, the heat oxidized film 58 undergoes etching to form an impurity introduction hole. In either method, the introduction hole is effected by the shape of the side wall 62. In the present invention, however, since the side wall 62 is even on the surface thereof, the unevenness can be restrained. In this way, it is possible to restrain dispersions of area of the emitter and diffusion depth.

After adhesion of the silicon film formed of the polysilicon or a-Si is made, in turn, the lead electrode 64 of the emitter electrode which is formed later is formed by etching the silicon film using the regist 63 as an etching mask (see FIG. 5C).

After adhesion of the silicon film, the lead electrode 64 of the emitter electrode which also serves as diffusion source, as shown in FIG. 5C, has As ion doped on the entire surface at a predetermined concentration with the resistance of the emitter electrode and impurity concentration in the emitter region taken into account. In this embodiment, as described above, the emitter contact hole 68 is shifted from the right top of the opening formed by the side wall 62 to side (see FIG. 4). To make possible such a structure as in FIG. 4, the lead electrode 64 is spread over the LOCOS film 52 (see FIG. 5C).

Figure 5D:
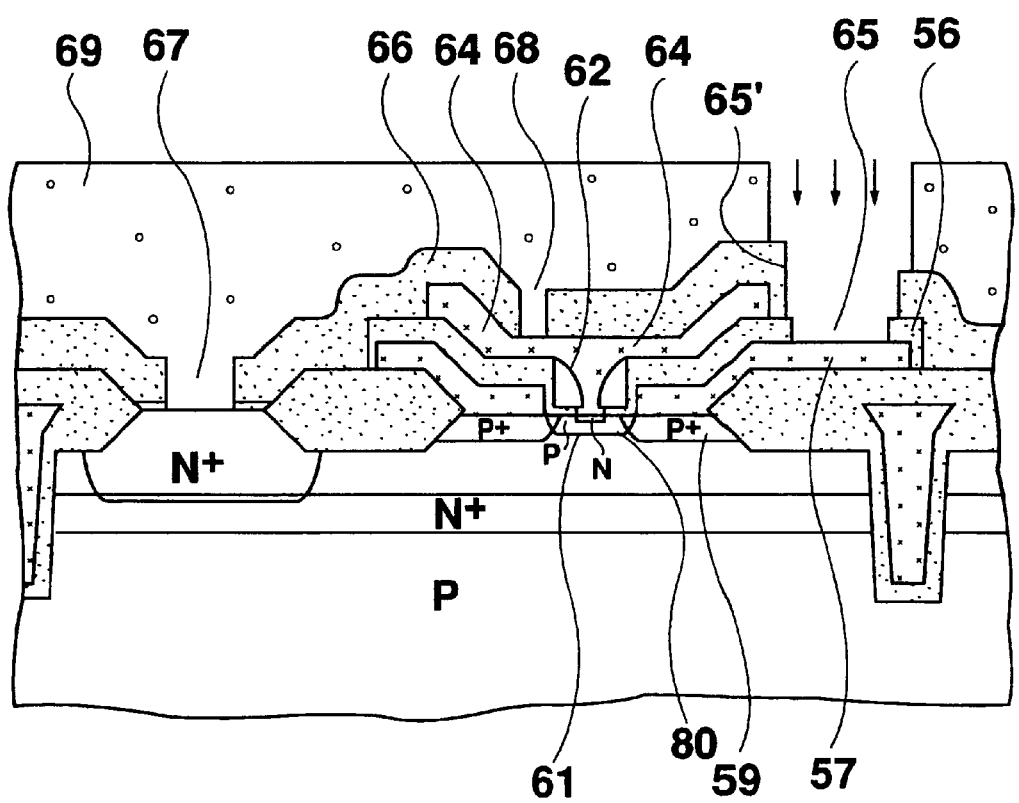

In turn, to form the base contact hole 65' for the lead electrode 57 of the base electrode, as shown in FIG. 5D, a part of the insulation film 56 undergoes etching and the insulation film 66 is formed over the entire surface. The insulation ilm 66 may be any of silicon oxidized film, silicon glass film, or silicon nitrided film.

Further, to form the contact 65, the collector contact hole 67, and the emitter contact hole 68 for the emitter electrode, etching is made. After that, $BF_2$ is ion-doped into the exposed contact 65 with use of a mask 69 for ion doping. This is made to decrease the contact resistance with the lead electrode 57 of the base electrode (see FIG. 5D).

Figure 1A:
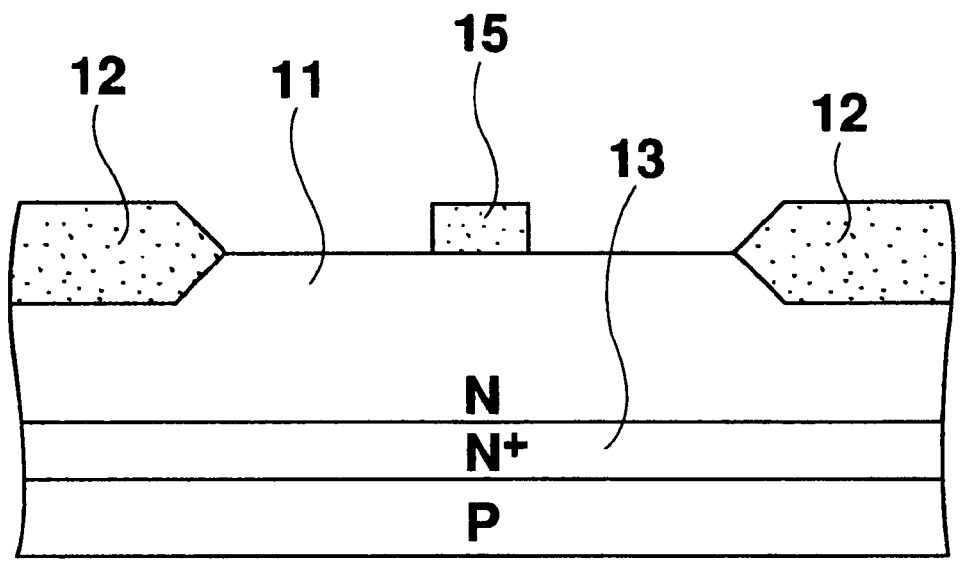
FIGS. 1A, 1B, 1C, 1D, 1E, 1F, and 1G are cross-sectional views illustrating a prior fabrication method of semiconductor integration device.
Figure 1B:
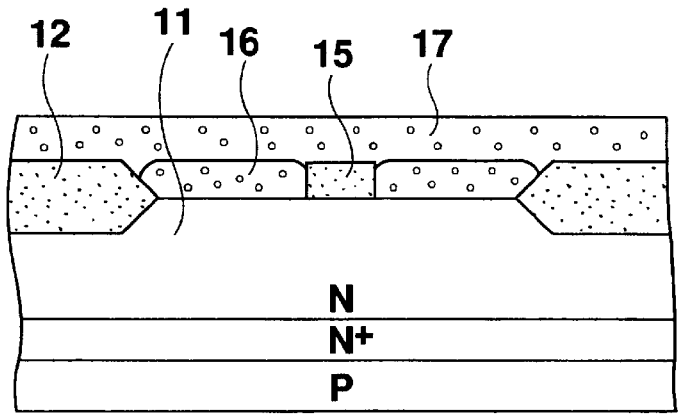
Figure 1C:
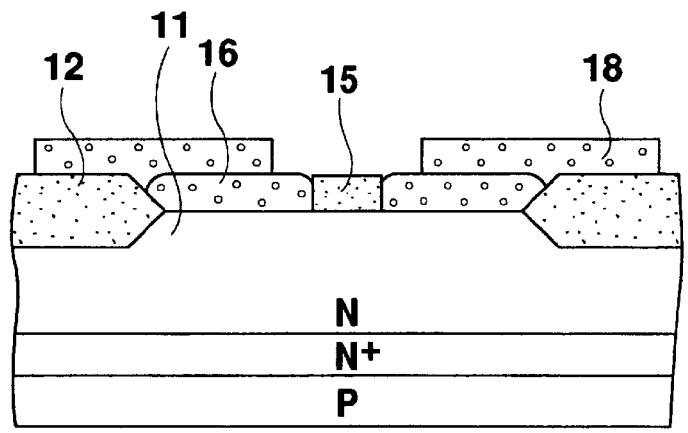
Figure 1D:
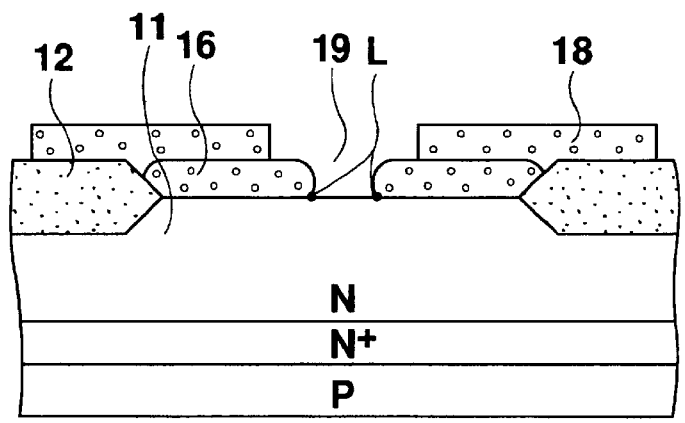
Figure 1E:
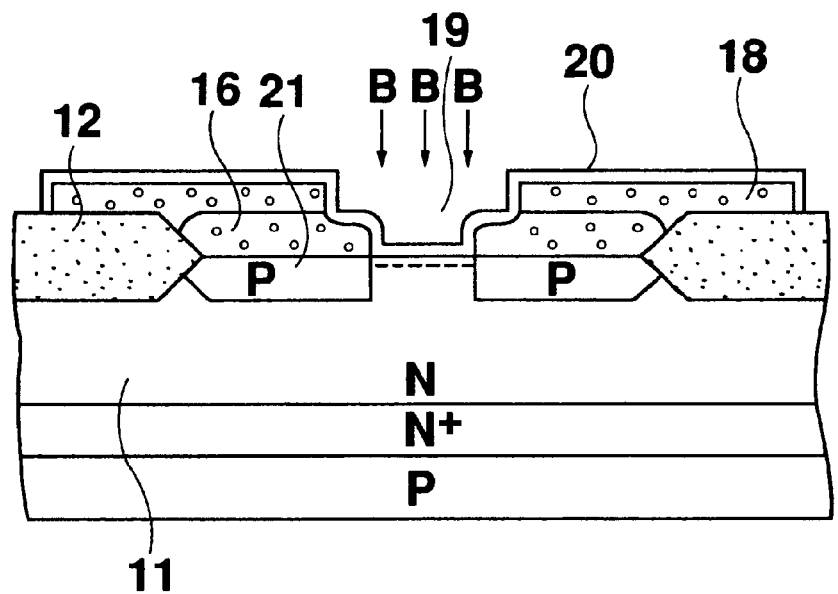
Figure 1F:
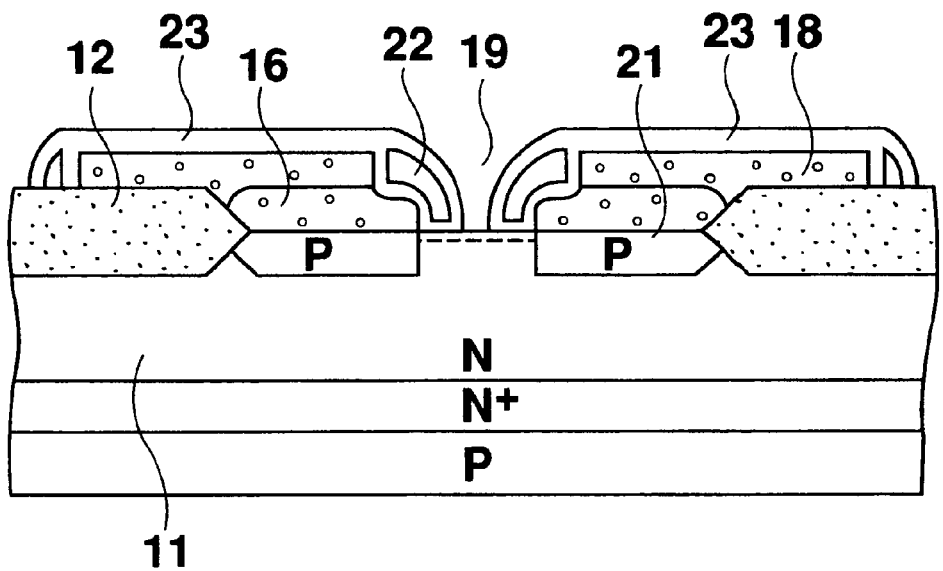
Figure 1G:
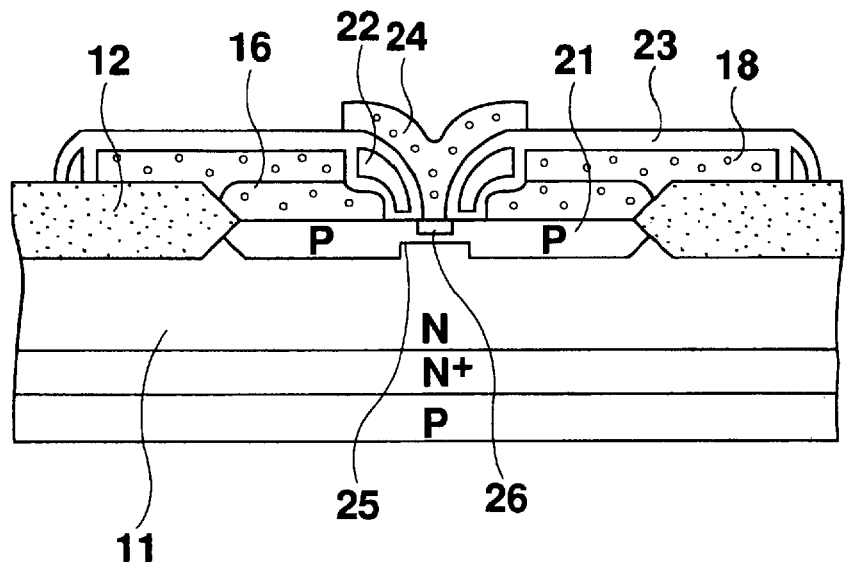
Figure 2:
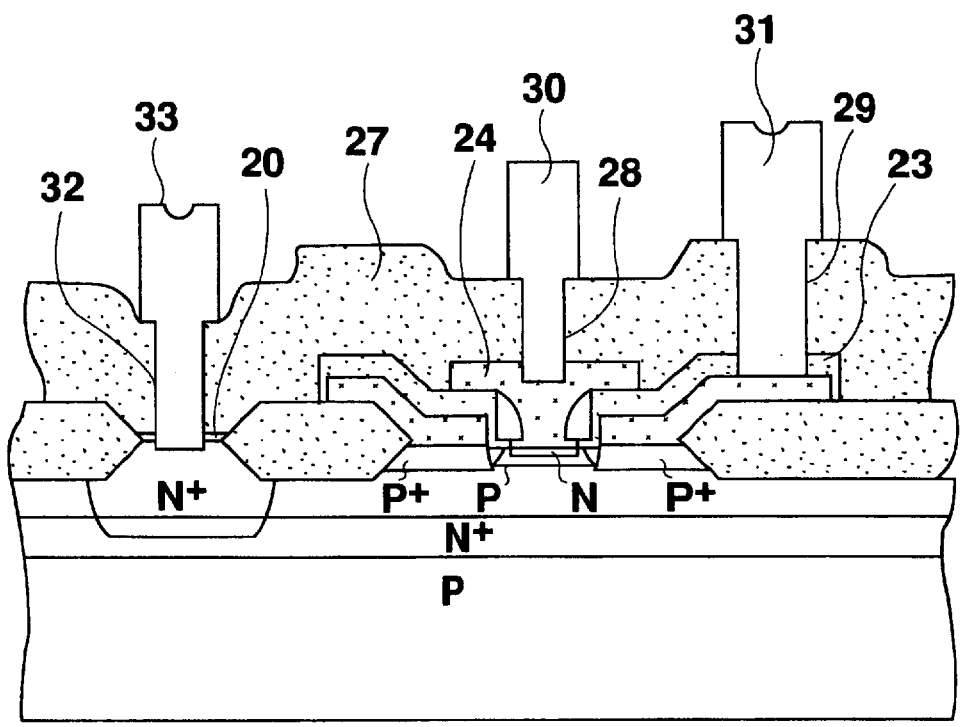
FIG. 2 is a cross-sectional view illustrating a prior structure of semiconductor integration device.
Figure 3:
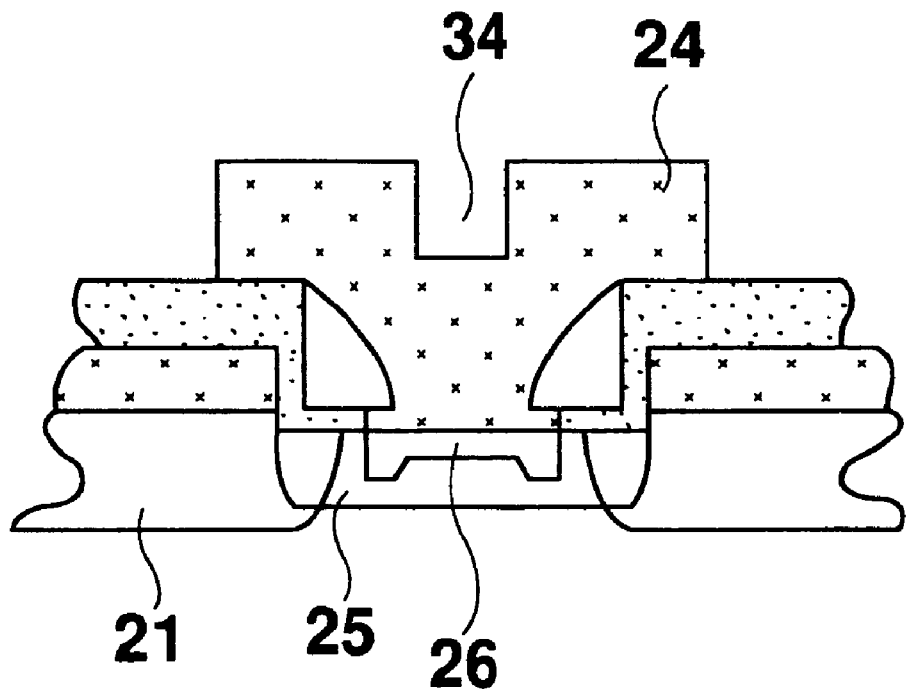
FIG. 3 is a cross-sectional view illustrating a shape of an emitter region of the semiconductor integration device shown in FIG. 2.

In that step, the insulation film 66 and the insulation film 56 may undergo etching at once without preforming the base contact hole 65'. As the insulation film 56 and the insulation film 66 are laminated at the position at which the base contact hole 65' is formed, total thickness of the film to undergo etching is greater than the other contact portion as the insulation film 56 is thereon. If the collector contact hole 67 is formed on the LOCOS film 52, the collector contact hole 67 becomes deeper, as the total film thickness of the insulator film on the collector incereases. In either case, the lead electrode 64 corresponding to the emitter contact hole 68 undergoes excessive etching so that recess is formed, until the collector contact hole 67 and the base contact 65 are completely formed. However, the impurity in the emitter region can be fully secured even if the lead electrode 64 undergoes etching excessively as the contact hole is formed out of the emitter region (the opening enclosed the side wall) in FIG. 5D, or on the LOCOS oxidized film 52 in FIG. 4 here. This means that such an uneven emitter region as in FIG. 3 can be restrained.

In turn, the resist 69 shown in FIG. 5D is removed before the whole substrate is heat-treated. As a result of the heat-treated, the ions doped in the lead electrode 57 before are diffused into the semiconductor layer to form the external base region 59 and at the same time, the emitter region 80 is formed by way of solid phase diffusion from the emitter lead electrode 64. Diffusion depth of the emitter region 80 is around 0.5 $\mu$m and the emitter region 80 is formed further outside by the side wall 62.

After that, the base electrode 70, the emitter electrode 71, and the collector electrode 72 are formed through light etching of the contact hole.

In the process described above, characteristics of transistors such as $h_{FE}$ can be accomplished as specified without difference of diffusion depth in the emitter region, resulting in little dispersion. Therefore, the microprocesser high frequency transistor can be fabricated.

In the embodiment described above, the lead electrode 57 of the base electrode and the side wall 62 are formed by the a-Si film or the film of heat-treated a-Si. Alternatively, if we take into account only removing the emitter contact from the emitter region, at least one of them may be formed of polysilicon.

The following describes why adhesion of the a-Si film should be made first.

Figure 6:
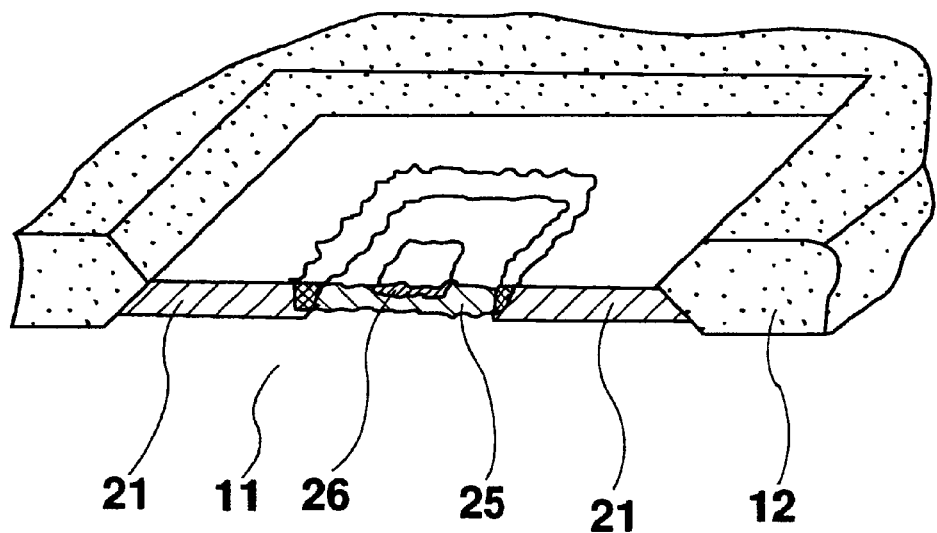
FIG. 6 is a view illustrating problems of a prior art.

The a-Si film, unlike polysilicon film, has no grain and grain boundary. The a-Si film therefore has the feature that the etched surface can be made smooth. If polysilicon undergoes etching, as shown in FIG. 6, the surface is made uneven as the grain boundary is faster in etching speed, resulting in unevenness of the surface and interface corresponding to the emitter region and active base region. However, the unevenness can be removed as a-Si is made smooth in the shape after etching.

Such a phenomenon occurs also in film that is adhered with a-Si first before it is heat-treated. Experimental results are described below by reference to FIGS. 7A, 7B to 11.

Figures 7A, 7B:
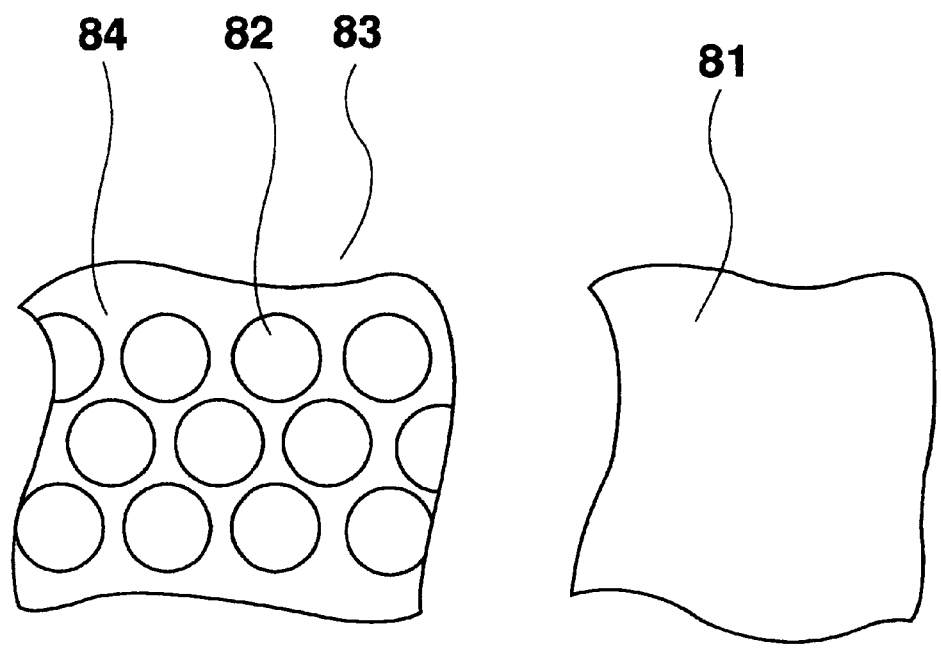
FIGS. 7A and 7B are a view illustrating a-Si of the present invention and a known polysilicon film.

FIGS. 7A, 7B to 9A, 9B depict views illustrating conversion states of the film. FIGS. 7A, 8A, 9A show growth of the film directly from polysilicon, while FIGS. 7B, 8B, 9B show transition of the film from amorphous silicon (hereinafter referred to as a-Si) to heat-treated state.

The flow of the experiment was as follows.

[I]: On a silicon substrate, silicon oxidized film of around 1000 Angstrom was grown.

[II]: The silicon substrate was inserted into the reaction chamber of an LPCVD apparatus and after it, 100% shiran (SiH4) gas was supplied at 540, 580, 600, and 620° C. Film thicknesses were 2000 Å, 3000 Å, 4000 Å, respectively. (The LPCVD used in the experiment may be replaced by plasma CVD.)

[III]: $BF_2$ was ion-doped on the whole surface at 60 KeV and $3 \times 10^{15}$.

[IV]: Annealing was carried out at 900° C. for one hour in a nitrogen atmosphere.

[V]: Sheet resistance Rs was measured.

Figure 10:
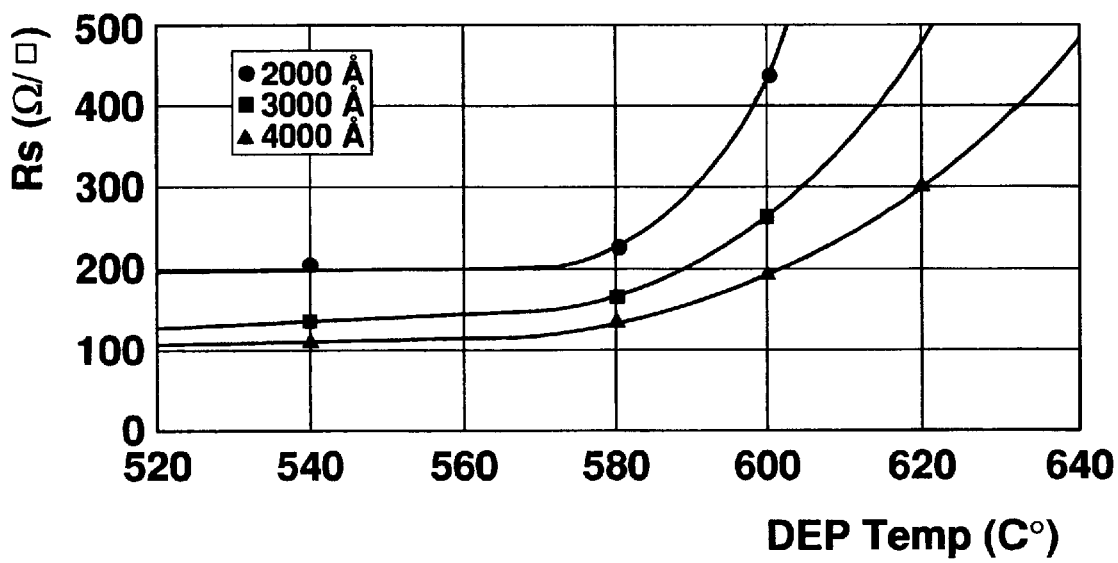
FIG. 10 is a view illustrating sheet resistance of the silicon films of the present invention and prior art.
Figure 11:
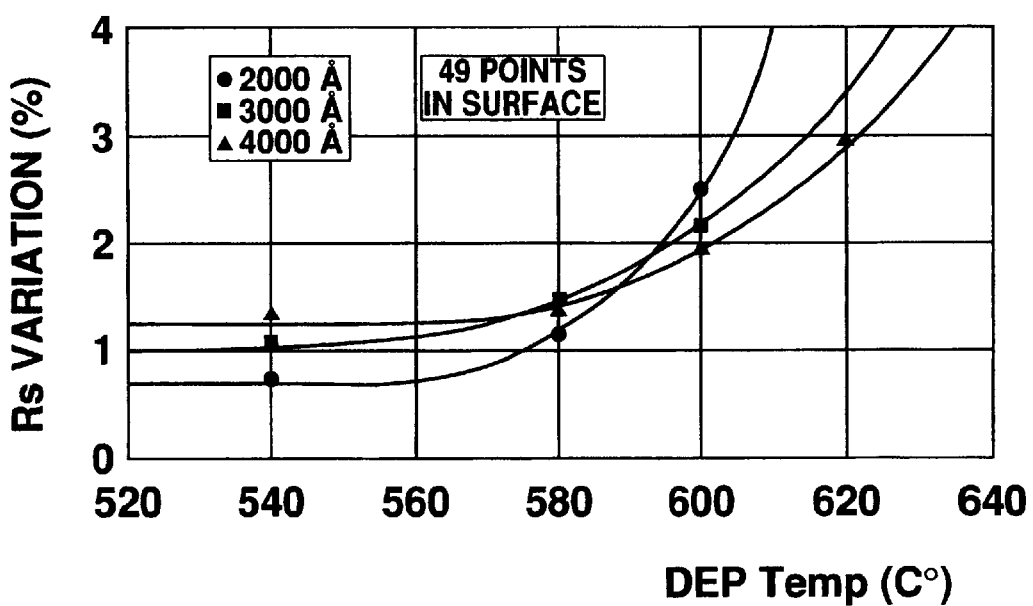
FIG. 11 is a view illustrating dispersion of the sheet resistance in FIG. 10.

Steps [I] and [II] are shown in FIGS. 7A and 7B, the state that step [III] was completed is in FIGS. 8A, 8B, the state that step [IV] was completed is in FIGS. 9A, 9B, and measurement results at step [V] are in FIG. 10 (the sheet resistance RS) and FIG. 11 (variation of the sheet resistance). Abscissa axes in FIGS. 10 and 11 take film forming temperature.

It was found from the measurement results that the sheet resistance and variation are low as the film forming temperature is low.

It was also found that step [II] of film forming at 520° C. to around 580° C. (hereinafter referred to as the low-temperature range) the Si film was in a state of amorphous silicon. At higher temperatures than 590° C. to 610° C. (hereinafter referred to as the high-temperature range), the surface state changed to a great extent and the Si film became polysilicon. At temperatures between around 580° C. to 600° C. (hereinafter referred to as the mid-temperature range), the surface would be in a transition region between polysilicon and amorphous silicon.

In the low-temperature range, as shown on FIG. 7B, the surface of the silicon film had little observable unevenness but formed a-Si 81 was visible under an electron microscope (×50,000). In the high-temperature range, on the other hand, as shown on FIG. 7A, the surface of the silicon film could be observed to have polysilicon film 83 of 500 Angstrom diameter as rather large grain 82. There was a grain boundary 84 between the grains 82

In turn, step [III] of ion doping has boron fluoride ($BF_2+$) 85 ion-doped as marked by x. We could regard that impurity dispersion of the a-Si film in FIG. 8B is substantially the same as the polysilicon film in FIG. 8A. It should be noted that, if boron is ion-doped, it goes through the a-Si film and polysilicon film. Instead, boron fluoride of large size entering near their surfaces was used. As ion, like boron fluoride, can be used because it does not enter deep.

The annealing process at step [IV] was carried out at between 800 to 1000° C., mostly around 900° C. The results differed from expectations. In the polysilicon film 83 in FIG. 9A, the grain is grown slightly large as it is subjected to heat treatment and can be observed with an electron microscope at 50000 power. However, in a-Si in FIG. 9B, it could not be decided whether grain existed or not. The a-Si was observed to be in the same state it was in prior to heat-treating. Either a polysilicon film having fine grains each being two or single digit order of Angstrom in diameter was generated, or the portion seen actually was single crystal and polysilicon film of greatly large grain. Also, no grain boundary was observed. In the former case, the grain boundary would be dispersed very narrow and small. If the latter, the grain would be very large and single one, substantially containing no grain boundary.

Roughly speaking, the Si film after annealing had grain of around 500 Angstrom in film forming in the high-temperature rage and the surface in film forming in the low-temperature range was far smoother than the high-temperature range although it was rough.

Therefore, when the polysilicon film in the high-temperature range was subjected to etching, as the grain boundary was faster in the etching speed, the surface was rough as observed with the electron microscope. The surface of the a-Si film in the low-temperature range was almost flat. This would be due to the fact that when the grain was in a very fine polycrystal state, the grain would become substantially flat even with selective etching. Alternatively, when the Si film has only a few large grains and the grain constructs a resister, the flat surface of the Si film remains substantially flat, despite being etched, as almost no grain boundary exists. In other case, a Si film formed in a low temperature range and annealed is adopted to clear patterning.

As described above, one feature of the present invention is that the shiran gas is made to flow to a wafer put in the plasma CVD or LPCVD apparatus at the low-temperature range to form the a-Si film, the impurity is diffused while the a-Si film is heat-treated, and the film is used as a lead electrode and diffusion source.

The film, as described above, is little in the variation of sheet resistance and the surface is so flat that it cannot be substantially distinguished from that of the a-Si film. The film therefore can be etching-processed at high accuracy without irregularities on the surface even with etching to a desired shape. With these two features of little variation of sheet resistance and accurate shape etching, the film can be used as a lead electrode, reducing the irregularities on the surface of semiconductor as in FIG. 6 and irregular diffusion surface to a great extent.

Therefore, variation of area of the external base region and the active base region can be reduced. Also, the surface of the active base region can be made flat, reducing the contact resistance. Further, the film of heat-treated a-Si, that is, the film shown in FIG. 9B, can be made lower in the sheet resistance than polysilicon, reducing resistance of the lead electrode.

Also, the other feature of the present invention is that the gas containing H and Si, for example, shiran gas, is made to flow to a wafer put in the plasma CVD or LPCVD apparatus at the low-temperature range to form the a-Si film before the film is heat-treated for use as a side wall. The impurity is diffused and the film is used as a lead electrode and diffusion source for the external base region 59.

The film, as described above, is little in the variation of sheet resistance and the surface is so flat that it cannot be substantially distinguished from that of the a-Si film. The film therefore can be etching-processed at high accuracy without irregularities on the surface even with etching to a desired shape. As etching can be made in the smooth state of surface, the film therefore is appropriate for the side wall. Also, with these two features of little dispersion of sheet resistance and accurate shape etching, the film can be used as the lead electrode for the base electrode, reducing the irregularities on the surface of semiconductor as in FIG. 6 and irregular diffusion surface to a great extent.

Therefore, as dispersion of diffusion depth in the emitter region can be restrained and irregularity on the interface of the emitter region and active base region can be restrained, dispersion of the $h_{FE}$ characteristic of a transistor can be restrained.

What is claimed is:

1. A semiconductor integration device comprising:

a base region having a first insulation film formed on a semiconductor layer with an opening through which the base region is exposed, an active base region being formed at about a center of the base region and an external base region formed to enclose the active base region, wherein the active base region and the external base region construct the base region, an emitter region formed in the active base region, a lead electrode for the external base region opened on the active base region, being led out from the external base region to an area on the first insulation film outside an external base region, a second insulation film covering the lead electrode for the external base region, being opened on the active base region, a side wall formed on a side of a base opening of the second insulation film formed on the active base region, wherein the side wall is a silicon film of amorphous silicon or a silicon film of heat-treated amorphous film, a lead electrode for the emitter region functioning as impurity diffusion source for the emitter region, being made to contact the emitter region through an emitter opening constructed on the emitter region by the side wall and being led out of at least the emitter opening, wherein the lead electrode includes a recess formed therein by an over-etching of the lead electrode, a third insulation film formed to cover the lead electrode for the emitter region and the second insulation film, a base contact hole formed to have a part of the lead electrode for the external base region exposed, an emitter contact hole formed to have a part of the lead electrode for the emitter region outside of the emitter opening, and a base electrode formed in the base contact hole and an emitter electrode formed in the emitter contact hole.

2. The semiconductor integration device according to claim 1, wherein:

the side wall and the semiconductor layer have an insulation film formed therebetween, the insulation film having an opening self-aligned with the side wall, the opening having the emitter region exposed.

3. The semiconductor integration device according to claim 1, wherein:

the lead electrode for the external base region and the side wall is a silicon film of amorphous silicon or a silicon film of heat-treated amorphous silicon.

4. A semiconductor integration device comprising:

a base region and a collector region having a first insulation film formed on a semiconductor layer with an opening to expose the base region and the collector region, an active base region being formed at about a center of the base region and an external base region formed to enclose the active base region, wherein the active base region and the external base region construct the base region;

an emitter region formed in the active base region, a lead electrode for the external base region opened on the active base region, being led out from the external base region to an area on the first insulation film outside an external base forming region, a second insulation film covering the lead electrode for the external base region, being opened on the active base region, a side wall formed on a side of a base opening of the second insulation film formed on the active base region, wherein the side wall is a silicon film of amorphous silicon or a silicon film of heat-treated amorphous silicon, a lead electrode for the emitter region functioning as impurity dispersion source for the emitter region, being made to contact the emitter region through an emitter opening constructed on the emitter region by the side wall and being led out of at least the emitter opening, a third insulation film formed to cover the lead electrode for the emitter region and the second insulation film, a collector contact hole formed to have a part of the collector region exposed, an emitter contact hole formed to have a part of the lead electrode for the emitter region outside the emitter opening, and an emitter electrode formed in the emitter contact hole and a collector electrode formed in the collector contact hole.

5. A semiconductor device comprising:

a base region and a collector region having a first insulation film, formed on a semiconductor layer with an opening to expose the base region and the collector region, an active base region being formed at about a center of the base region and an external base region formed to enclose the active base region, wherein the active base region and the external base region construct the base region, an opened region of the collector region has a thin insulation film formed thereon, an emitter region formed in the active base region, a lead electrode for the external base region opened on the active base region, being led out from the external base region to an area on the first insulation film outside an external base forming region, a second insulation film covering the lead electrode for the external base region, being opened on the active base region, a side wall formed on a side of a base opening of the second insulation film formed on the active base region, a lead electrode for the emitter region functioning as impurity dispersion source for the emitter region, being made to contact the emitter region through an emitter opening constructed on the emitter region by the side wall and having led out of at least the emitter opening, a third insulation film formed to cover the lead electrode for the emitter region and the second insulation film, the third insulation film is formed to cover the thin insulation film, a collector contact hole formed to have a part of the collector region exposed, an emitter contact hole formed to have a part of the lead electrode for the emitter region outside the emitter opening, and an emitter electrode formed in the emitter contact hole and a collector electrode formed in the collector contact hole.

6. The semiconductor integration device according to claim 4, wherein:

the emitter contact hole and the collector contact hole are formed in the same etching process.

7. The semiconductor integration device according to claim 6, wherein:

the emitter contact hole and the collector contact hole are formed substantially simultaneously.

8. The semiconductor integration device according to claim 4, wherein:

the lead electrode for the external base region is a silicon film of heat-treated amorphous silicon.

9. The semiconductor integration device according to claim 4, wherein:

the opened region of the collector region has a thin insulation film formed thereon, and the third insulation film is formed to cover the thin insulation film.

* * * * *

UNITED STATES PATENT AND TRADEMARK OFFICE
CERTIFICATE OF CORRECTION

PATENT NO. : 6,051,872 Page 1 of 1
DATED : April 18, 2000
INVENTOR(S) : Satoru Kaneko et al.

It is certified that error appears in the above-identified patent and that said Letters Patent is hereby corrected as shown below:

Column 3,
Line 11, remove "An other" and insert therefor -- Another --

Column 5,
Line 35, after "before" delete "heattreating" and insert therefor -- heat-treating --.

Column 8,
Line 40, after "insulation" delete "ilm" and insert therefor -- film --
Line 57, after "collector" delete "incereases" and insert therefor -- increases --

Column 10,
Line 18, after "82" insert -- . --
Line 45, after "temperature" delete "rage" and insert therefor -- range --

Signed and Sealed this

Thirteenth Day of January, 2004

JON W. DUDAS
*Acting Director of the United States Patent and Trademark Office*